United States Patent [19]

Radhakrishnan

[11] Patent Number: 5,650,361
[45] Date of Patent: Jul. 22, 1997

[54] LOW TEMPERATURE PHOTOLYTIC DEPOSITION OF ALUMINUM NITRIDE THIN FILMS

[75] Inventor: Gouri Radhakrishnan, Culver City, Calif.

[73] Assignee: The Aerospace Corporation, El Segundo, Calif.

[21] Appl. No.: 560,759

[22] Filed: Nov. 21, 1995

[51] Int. Cl.$^6$ .................................................. H01L 21/02
[52] U.S. Cl. ...................... 437/237; 437/228; 437/241; 427/555; 204/192.25; 148/DIG. 113; 148/DIG. 158
[58] Field of Search .................... 437/228, 236, 437/237, 241; 427/554, 555; 148/DIG. 113, DIG. 158; 204/192.22, 192.25

[56] References Cited

U.S. PATENT DOCUMENTS

| | | |
|---|---|---|
| 3,600,218 | 8/1971 | Pennebaker . |
| 3,634,149 | 1/1972 | Knippenberg ........................ 148/175 |
| 4,030,942 | 6/1977 | Keenan et al. ........................ 148/1.5 |
| 4,152,182 | 5/1979 | Rutz ........................................ 148/175 |
| 5,221,527 | 6/1993 | Dom et al. ............................ 423/412 |
| 5,270,263 | 12/1993 | Kim et al. ............................ 437/236 |
| 5,356,608 | 10/1994 | Gebhart ................................ 423/412 |

FOREIGN PATENT DOCUMENTS

| | | | |
|---|---|---|---|
| 406084893 | 3/1994 | Japan | 437/236 |

OTHER PUBLICATIONS

"RF–Sputtered Aluminum Nitride Films on Sapphire", Shuskus, A.J. Reeder, T.M., Paradis, E.L. Appl. Phys. Lett. vol. 24, pp. 155–156, 1974.

"Single–phase Aluminum Nitride Films by dc–magnetron Sputtering" Morgan, J.S., Bryden, W.A., Kistenmacher, T.J., Ecelberger, S.A. Poehler, T.O. J. Mater. Res., vol. 5, No. 11, Nov. 1990, pp. 2677–2681.

"Preparation and Properties of Aluminum Nitride Films Using An Organometallic Precursor" Interrante, L.V. and Lee, W., McConnell, M., Lewis, N. Hall, E. J. Electrochem. Soc., vol. 136, No. 2, pp. 472–478, Feb. 1989.

Atmospheric Pressure Chemical Vapor Depostion of Aluminum Nitride Thin Films at 200–250°C, Gordon, R.G., Hoffman, D.M., Riaz, U. J. Mater. Res., vol. 6, No. 1, Jan. 1991, pp. 5–7.

Low Temperature Growth of Polycrystalline AlN Films by Microwave Plasma CVD, Someno, Y., Sasaki, M., Hirai, T. Jap. J. Appl. Phys., vol. 29, No. 2, pp. 358–360, Feb. 1990.

Growth of GaN, AlN and InN By Electron Cyclotron Resonance–Metal Organic Molecular Beam Epitaxy, Wisk, P.W., Abernathy, C.R. Pearton, S.J., Ren, F., Lothian, J.R., Katz, A., Jones, K. Mat. Res. Soc. Symp. Proc., vol. 282, pp. 509–604, 1993.

"Laser–induced chemical Vapor Deposition of AlN films" Li, X, and Tansley, T.L. J. Appl. Phys. vol. 68, No. 10, 15 Nov. 1990, pp. 5369–5371.

"Photochemical growth of GaN and AlN on sapphire (0001) and GaAs (100)" John, P.C., Alwan, J.J., and Eden, J.G. Thin Solid Films, vol. 218, pp. 75–79, 1992.

(List continued on next page.)

*Primary Examiner*—John Niebling
*Assistant Examiner*—Long Pham
*Attorney, Agent, or Firm*—Derrick M. Reid

[57] ABSTRACT

Thin films of aluminum nitride are deposited at 350 K on silicon, GaAs, fused quartz, and KBr substrates using gas-phase 193 nm excimer laser photolysis of trimethylamine alane and ammonia precursors without a thermally induced or a spontaneous reaction between them, resulting in AlN thin films that are amorphous, smooth and featureless having a band gap of 5.8 eV, a refractive index of 2.0, a breakdown electric field breakdown of $10^8$ V/m, a low-frequency dielectric constant of 6.0–6.9, high-frequency dielectric constant of 3.9–4.0, well suited for many thin film applications.

10 Claims, 1 Drawing Sheet

Low Temperature AlN Thin Film Deposition System

OTHER PUBLICATIONS

"Surface Morphology of Pulsed-laser Deposited Aluminium Nitride Thin Films" Kotula, P.G., Carter, C.B., Norton, M.G. J. Mater. Sci. Lett. vol. 13, pp. 1275–1277, 1994.

"Laser Deposition of AlN Thin Films on InP and GaAs" Bhattacharyz, P., and Bose, D.N. Jap. J. Appl. Phys., vol. 30, No. 10A, pp. 1750–1752 Oct. 1991.

"Initial Stages of AlN Thin-film growth on Alumina Using Trimethylamine Alane and Ammonia Precursors", Bertolet, D., Liu, H., Rogers, J.W. J. Appl. Phys. vol. 75, No. 10, pp. 5385–5390, May 1994.

Low Temperature AlN Thin Film Deposition System

5,650,361

LOW TEMPERATURE PHOTOLYTIC DEPOSITION OF ALUMINUM NITRIDE THIN FILMS

STATEMENT OF GOVERNMENT INTEREST

The invention was made with Government support under Contract No. F04701-93-C-0094 by the Department of the Air Force. The Government has certain rights in the invention.

The invention described herein may be manufactured and used by and for the government of the United States for governmental purpose without payment of royalty therefor.

SPECIFICATION

FIELD OF THE INVENTION

The present invention relates to the field of semiconductor processing. More specifically, the invention relates to laser chemical vapor deposition of aluminum nitride thin films.

BACKGROUND OF THE INVENTION

The deposition of thin films of aluminum nitride (AlN) has generated tremendous interest due to the unique combination of material properties that make AlN an important III-V compound. The large direct band gap of 6.2 eV, high melting point of 3273 K, high thermal conductivity of 320 W/mK at 300 K, thermal expansion coefficient match to GaAs ($6.3\times10^{-6}$/K for AlN and $6.9\times10^{-6}$/K for GaAs), high acoustic velocity of 6 km/s, and low dielectric loss are excellent properties that make AlN the material of choice for many applications. Thin films of AlN are valuable for many applications including a gate dielectric and passivation layer in integrated circuits, optical coatings, heat sinks in electronic packaging applications, a material for surface acoustic wave devices, and wear-resistant, hard coatings for tribological applications. While several different methods are being employed for the deposition of AlN on various substrates, these methods typically involve heating the substrates to temperatures greater than 473 K. For a number of applications, most importantly in microelectronic devices involving GaAs and Si substrates, and also in tribological applications, the high temperatures needed to grow high-quality AlN films by currently available methods pose a serious problem due to the thermal sensitivity of the substrates. This problem is enhanced for GaAs devices, which suffer from lack of a suitable dielectric layer such as GaN, due to the inherent difficulties associated with growing GaN at low temperatures. Consequently, the growth of AlN films at low temperatures has become increasingly important and valuable.

The various methods that have been used to deposit AlN thin film include reactive sputter deposition, metalorganic chemical vapor deposition (MOCVD), chemical vapor deposition (CVD), microwave plasma CVD, electron cyclotron resonance metalorganic molecular beam epitaxy (ECR-MOMBE), laser chemical vapor deposition (LCVD),and pulsed laser deposition (PLD).

Reactive sputtering (rf or dc planar magnetron sputtering) has been used at substrate temperatures ranging from 473 K to 1473 K. The target is typically aluminum (Al) which is sputtered in the presence of nitrogen gas. One of the main problems associated with this technique is that in general the AlN films tend to be a multiphase material including both metallic Al and AlN. This mixture of phases makes it difficult to control the properties of these films. Electrical conductivity is strongly affected by Al filaments, inducing bistable resistance.

Several of the MOCVD and CVD techniques that have been aimed at epitaxial growth typically require high temperatures of 1200–1400 K. Epitaxial films of AlN on Si have been grown at 673 K using metalorganic surface chemical adsorption deposition (MOSCAD) with trimethylaluminum and ammonia as precursors. Chemical vapor deposition was used to produce amorphous films of AlN on Si at a temperature of 473–523 K. There are no known CVD techniques that have successfully deposited AlN films at temperatures lower than 473 K.

Microwave plasma CVD has been used to grow polycrystalline AlN on Si(100) substrates. The growth temperature was 823 K. The technique of ECR-MOMBE is both complex and expensive as it combines an expensive ultra-high vacuum MBE system with a custom designed ECR plasma source to generate nitrogen atoms in-situ. In addition, typical substrate temperatures were 823–1023 K.

LCVD methods for the growth of AlN and aluminum oxynitride ($AlO_xN_y$) have used trimethylaluminum and ammonia as precursors of aluminum and nitrogen respectively and 193 nm excimer laser radiation for photolysis. At substrate temperatures of 373–723 K, the films were primarily $AlO_xN_y$. AlN films were obtained only at temperatures greater than 723 K. Recently, LCVD has produced AlN films with good optical and electrical properties using trimethylaluminum and ammonia at temperatures of 443–473 K and 193 nm excimer laser radiation for photolysis. AlN films have also been grown on sapphire and GaAs substrates using both a xenon lamp and an excimer laser. These depositions were performed at fairly high substrate temperatures of 873–973 K.

PLD methods have used a KrF laser at 248 nm to deposit AlN films on sapphire at 943 K. Investigation of the morphological properties of the films indicated that they were poor in quality and contained numerous particulates. The deposition of AlN films has also been achieved using a pulsed ruby laser for evaporation of Al targets at 300 K. This method of deposition does not rely on gas phase laser photolysis. In addition, a ruby laser has poor output energies and is not the laser of choice for manufacturing processes. U.S. Pat. Nos. 5,356,608 and 5,221,527 also teach high temperature AlN deposition methods.

Most of the methods listed above, although successful in depositing AlN films, do so at substrate temperatures that are 473 K or higher. For microelectronic applications, it is desirable to lay down dielectric caps on pre-fabricated devices and wafers at low temperatures, in order to reduce thermal damage to the underlying devices. Specifically, for GaAs devices, it is extremely useful to be able to deposit films at as low a temperature as possible preferably lower than 473 K due to the added precautions that need to be taken to prevent the out-diffusion of As and also to prevent thermal degradation of the commonly used gold-germanium (Au/Ge) ohmic contacts. Additionally, for tribological applications, wear-resistant coatings are deposited typically on mechanical components that are made of stainless steel, which is susceptible to thermal degradation.

A study of the initial stages of AlN thin film growth by low-temperature chemical vapor deposition on alumina ($Al_2O_3$) substrates has used trimethylamine alane (TMAA) $N(CH_3)_3AlH_3$ and ammonia $NH_3$ as precursors. Analytical techniques such as Fourier Transform Infrared spectroscopy and X-ray Photoelectron Spectrosopy (XPS) were used to monitor the reaction between the two precursors, following exposure of the substrate to high doses of both. Using XPS analysis, the authors claimed that the Al—N bond could be detected on the Al2O3 substrate at 400 K, but not at 300 K. From this it was inferred that a spontaneous chemical reaction between TMAA and NH3 on an alumina surface occurs at 400 K, but not at 300 K. However, no macroscopic and measurable thin film of AlN was deposited in this study.

All of the prior methods have not provided good quality AlN at a low temperature. These and other disadvantages are solved or reduced using the present invention.

SUMMARY OF THE INVENTION

An object of this invention is to produce AlN thin films deposited at low temperatures.

Another object of this invention is to deposit AlN thin films at a temperature less than 373 K. Yet another object of the present invention is to use laser chemical vapor deposition (LCVD) of AlN thin films using trimethylamine alane (TMAA) N(CH3)3AlH3 and ammonia NH3 as precursors.

Still another object of the invention is to use laser chemical vapor deposition of AlN thin films using TMAA and ammonia as precursors at a temperature less than 373 K.

A further object of the present invention is to use laser chemical vapor deposition of AlN thin films using a 193 nm excimer laser, using TMAA and ammonia as precursors at suitable partial pressures, and at a temperature less than 373 K.

The present invention provides a method by which high-quality thin-films of AlN can be deposited on a variety of substrates at an extremely low temperature, for example 350 K using gas-phase excimer laser photolysis of trimethylamine alane (TMAA) and ammonia (NH3). The gas-phase photochemistry of TMAA is employed to generate aluminum containing radicals that can then react on the substrate surface with radicals produced by the photodissociation of NH3. Unlike the commonly used alternative source of aluminum, namely trimethylaluminum, the choice of TMAA for the gas-phase photolysis favors the growth of AlN films without having to supply additional surface energy through thermal means or via laser-induced heating of the substrate. In the preferred system, a 193 nm excimer laser beam propagates parallel to the substrate, without grazing it, thereby eliminating any laser heating of the substrate. The parallel configuration exclusively initiates gas-phase reactions that are necessary for AlN formation. The laser is not configured perpendicular to the substrate in order to prevent the deposition of metallic aluminum (Al) by laser heating of TMAA. Unlike trimethylaluminum which is highly pyrophoric, TMAA is safe and easy to use and this lends a significant and distinct safety advantage in a production environment.

Well adhering, smooth, amorphous films of aluminum nitride have been deposited on Si(100), GaAs(100), fused quartz, and KBr substrates at 350 K by the gas-phase excimer laser photolysis of trimethylamine alane and ammonia at 193 nm. The properties of these laser-deposited films were studied using scanning electron microscopy, energy dispersive X-ray analysis, X-ray diffraction, optical absorption, infrared spectroscopy, ellipsometry, and electrical measurements. X-ray photoelectron spectroscopy was used to provide information regarding the chemical compositions on the surface and in the bulk of these laser deposited films, as well as on the chemical states of the components of the films. These and other advantages will become more apparent from the following detailed description of the preferred embodiment.

DETAILED DESCRIPTION OF THE PREFERRED EMBODIMENT

Figure 1:
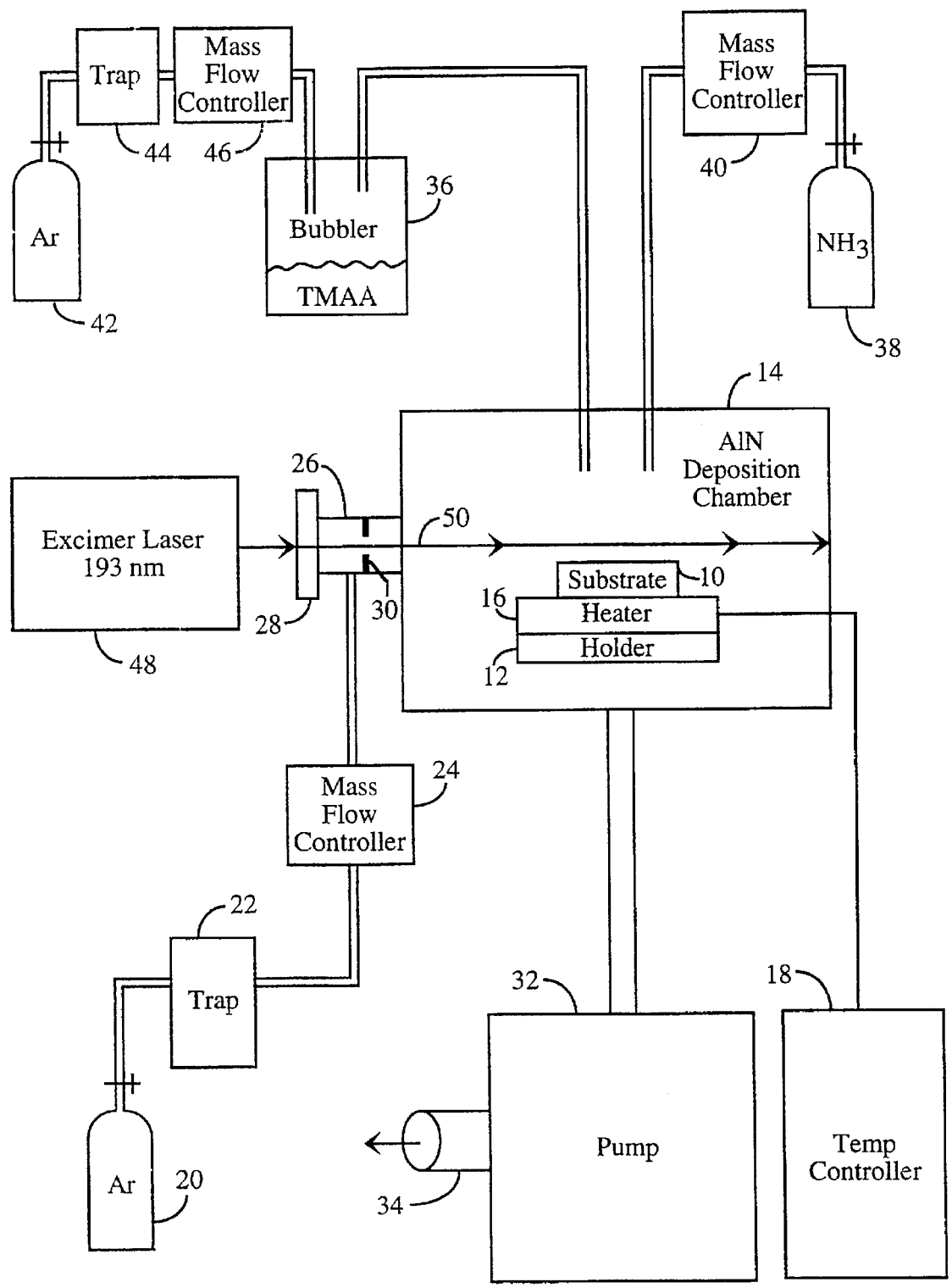
FIG. 1 is a block diagram of a Aluminum Nitride Photolytic Deposition System.

An embodiment of the present invention is described with reference to the drawing using reference designations as shown in the drawing. A substrate 10 is positioned by a holder 12 in an aluminum nitride (AlN) deposition chamber 14 having a heater 16 to maintain a constant temperature by a temperature controller 18. An argon (Ar) source 20 preferably transports the Ar gas through a trap 22 to freeze and eliminate any water and other impurities in the gas, through a mass flow controller 24 to control the gas, through an inlet 26 having a window 28 and a baffle 30. The chamber is equipped with a pump 32 having an exhaust 34 to pump the gases and control the total pressure inside the chamber 14. TMAA vapor from a solid TMAA source held in a bubbler 36 and ammonia gas from an ammonia NH3 source 38 are used as photolysis precursors and are introduced into the chamber 14. NH3 gas is controlled by mass flow controller 40. TMAA vapor from bubbler 36 is carried into chamber 14 by the argon gas from another Ar source 42 which passes through a trap 44 and through a mass controller 46. A 193 nm excimer laser 48 generates a laser beam passing through a window 28, inlet 26 and baffle 30 to extend parallel to a deposition surface of the substrate 10. The photons produced by the laser interact with the NH3 and TMAA precursor gases above and in proximity to the surface of substrate 10 causing dissociation of the TMAA and NH3 precursors to deposit a quality AlN thin film on the substrate, as the pump 32 evacuates the remaining by-products of the dissociated TMAA and NH3 precursors.

The substrates for the LCVD of AlN may be Si(100), GaAs(100), fused quartz, and KBr. The substrate cleaning procedure employed for the Si(100) wafers involves a solvent clean in trichloroethylene, acetone, and water, followed by a standard RCA clean. The RCA cleaning involves dipping the Si wafers in two separate elevated-temperature chemical baths, not shown. The first bath consists of a heated mixture of water ($H_2O$), ammonium hydroxide ($NH_4OH$), and hydrogen peroxide ($H_2O_2$) in a 5:1:2 ratio, maintained at 358 K. Following immersion in this bath for ten minutes, the wafers are rinsed with water at 18 Mohms for ten minutes and then dipped in a room-temperature solution of hydrofluoric acid (HF), diluted 10:1 with water. Following another water rinse, the wafers are dipped in the second bath which comprises a heated mixture of $H_2O$, hydrochloric acid (HCl), and $H_2O_2$, in a 5:1:2 ratio, and maintained at 358 K. The wafers are held in this bath for ten minutes and then rinsed with water. Finally the wafers are spin-dried. The GaAs substrates undergo a thirty-second dip in a 1:1 solution of HCl and $H_2O$, followed by a two-minute rinse in 18 Mohms water and are then spin-dried. The fused quartz substrates are subjected only to a solvent clean similar to that used for the Si wafers, rinsed with water, and dried in a stream of nitrogen. The KBr substrates may be used without any special cleaning.

The excimer laser 48, for example, a Lambda Physik LPX 201 laser, operating with ArF at a wavelength of 193 nm and a repetition rate of 10 Hz, may be used. A one meter focal length cylindrical lens, not shown, may be used to generate a flat sheet of the laser beam 50 propagating parallel to the substrate 10 and preferably positioned 1–4 mm above the deposition surface. The laser power is controlled to produce a range of incident laser fluences from 0–200 mJ/cm$^2$, preferably set between 5–200 mJ/cm$^2$ and most preferably set at 80 mJ/cm$^2$. The entrance inlet 26 for the laser beam is preferably purged with Ar during the deposition to prevent any deposition on the window. The base pressure in the turbo-pumped vacuum chamber 14 is preferably between 1×10$^{-7}$ and 5×10$^{-8}$ torr. Following evacuation, a bakeout of the entire vacuum chamber 14 is preferred, as well as heating the substrate to about 425 K to desorb any volatile surface impurities. The chamber should then be cooled down to room temperature. The source gas for aluminum, that is the TMAA gas is then introduced into the chamber 14 at a partial pressure of preferably between 1×10$^{-3}$ torr and 1×10$^{-2}$ torr, most preferably 5×10$^{-3}$ torr using Ar as the carrier gas. NH$_3$ is also introduced into the chamber at a partial pressure of preferably between 5×10$^{-3}$ and 20×10$^{-2}$ torr, most preferably 35×10$^{-3}$ torr. Preferably, the ratio of the partial pressures of the NH$_3$ and TMAA precursor gases is at least 5:1. The total pressure in the system during deposition is preferably less than 0.5 torr. The substrate 10 is heated by the heater 16 that could be controlled with a feedback to the temperature controller 18. Substrate temperatures may be measured by a chromel-alumel thermocouple, not shown, attached to a copper heater block 16 accurate to 5 K. Trace quantities of water, if present in the Ar carrier and purge gases should be reduced to negligible quantities by passing the gases through traps 44 and 22 which may be a bath of dry ice at 195 K or may be a lower temperature bath using a slush of n-propanol and liquid nitrogen at 125 K. Other traps, such as absorbers and filters may be used as well.

The system eliminates the potential for causing thermal damage to the substrate 10 by using a process that is non-thermal in nature. Instead of inducing deposition through thermal decomposition of precursors over a pre-heated substrate, the present system makes use of gas-phase photodissociation of the combination of precursors of aluminum and nitrogen. The deposition can occur even at room temperature, i.e. 300 K, however to obtain good adhesion of the films to the substrate, a slightly higher temperature of 350 K is preferred. The substrate temperature is below the thermal decomposition temperatures of both TMAA and NH$_3$. In addition, the laser beam 50 propagates parallel to the substrate 10 to preclude any laser heating of the substrate 10.

Thin films of aluminum nitride are grown at low temperatures by relying on laser photochemical reactions to generate the active chemical species necessary for film growth. Films grown by this technique exhibit good properties. Typical growth rates at 10 Hz are 8–15 nm/min over the range of laser fluences employed. These correspond to 0.48–0.90 µm/hr. The rate can be scaled up with higher laser fluences and repetition rates. The AlN films are well adhering, smooth, featureless, and amorphous. The films are optically transparent over a wide range of wavelengths and have a band gap of 5.8 eV. The films have excellent dielectric properties. The films have a breakdown electric field of 1.2–1.8×10$^8$ V/m, a high-frequency dielectric constant of 3.6–4.0 and a low-frequency dielectric constant of 6.0–6.9. With applied electric fields of up to 5×10$^7$ V/m, the specific resistivities were found to be 0.5–1.0×10$^{13}$ ohm-cm. The optical and electrical properties compare well to properties of crystalline AlN grown at significantly higher temperatures by other techniques. The possibility of growing high-quality nitride films at such low temperatures makes this technique viable for a number of microelectronic and tribological applications where substrates are prone to thermal damage at higher temperatures. The technique described here is particularly well suited for depositing AlN films on GaAs substrates. Another application of this process is the deposition of AlN as a window material and capping layer on AlGaAs/GaAs laser diodes as the AlN films are optically transparent in the region of 700–800 nm. In addition, high thermal conductivity of the AlN films will promote efficient heat-transfer to a heat sink during device operation. The process is well suited for large-area deposition as a sheet of laser light can be easily generated and this in turn can generate active chemical radicals over large areas of the substrate. Unlike trimethylaluminum, a highly pyrophoric precursor of Al, commonly used for AlN growth, the TMAA precursor is non-pyrophoric, which simplifies its handling. This provides a significant safety advantage in a production environment. The technique can be used for depositing other nitride films through proper selection of readily photo-dissociable precursors.

Films grown under these conditions can be characterized by various analytical techniques, such as X-ray diffraction (XRD), scanning electron microscopy (SEM), energy dispersive X-ray (EDX) analysis, secondary ion mass spectrometry (SIMS), X-ray photoelectron spectroscopy (XPS), optical absorption, and electrical measurement systems. Film thickness may be measured by both a spectrophotometric film thickness measurement system, for example, a NanoSpec/AFT system, as well as a stylus profilometer, for example, a Sloan Dektak-IIA profilometer. SIMS analyses with an ion microprobe mass analyzer (IMS-5f) uses a two nano-ampere beam of $^{133}$Cs$^+$ ions accelerated to ten kV and focused to a ten micron spot. A sample bias of 4.5 kV may be used. The primary beam may be rastered over a film area of 100 µm×100 µm. To prevent charging, a normal incidence beam of electrons may be focused on the film area.

The AlN films may be characterized for electrical properties with current-voltage (I-V) measurements using a Hewlett-Packard (4145B) curve tracer and capacitance-voltage (C-V) measurements at a frequency of 1 MHz, using an MDC capacitance meter (CSM/16-Model 72B).

The optical absorption properties of these films may be measured at ultraviolet and visible wavelengths. Infrared (IR) spectroscopy near the 10 µm spectral region may also be used. For the UV-visible spectra, AlN films may be deposited on quartz substrates, while films grown on KBr may be utilized for IR measurements. UV visible spectra may be measured with a Perkin-Elmer Lambda-9 spectrophotometer from 185 to 800 nm. A slit width of 2 nm and a scan speed of 120 nm/min may be used. The IR spectra may be measured on a Nicolet Fourier Transform Infrared (FTIR) spectrometer.

An X-ray photoelectron spectroscopy, (XPS) system, such as a Surface Science Instruments system, uses monochromatic Al-Kα X-rays and is equipped with a heating stage so that samples can be annealed and analyzed without exposure to the atmosphere. The X-rays may be focused to give a spot size of 800 µm on the sample surface. Analyzer pass energies of 150 eV and 50 eV may be used for wide scans and high-resolution spectra respectively. The XPS analysis chamber may be pumped by ion and titanium sublimation pumps to a base pressure of 5×10$^{-11}$ torr. The core level spectra are deconvoluted into peaks comprising sums of Gaussian and Lorentzian functions. Relative atomic amounts can be calculated from estimates of the electron escape depth and Scofield tables. Such calculations assume a homogeneous distribution of species perpendicular to the surface, hence resultant relative concentrations are only semi-quantitative. The electron escape depths for photoelectrons produced by Al-Kα X-rays are 1.5–2.0 nm because a non-normal photoelectron take-off angle is used (60° off-normal). Ar+ ions at 2 kV may be used for sputter-etching the samples to reveal composition information in the bulk of the film. XPS spectra may be recorded following sputtering the sample for varying periods of time.

At room temperature (300 K), laser photolysis does initiate AlN formation in the gas-phase. However the AlN deposits as a fine powder on the substrate with very poor adhesion. The adhesion of the LCVD grown AlN films is tremendously improved by raising the substrate temperature to 350 K. It is known that TMAA decomposes at 373 K. A temperature of 350 K resulted in good adhesion of the films without thermal decomposition of TMAA. The UV-visible optical absorption spectra of a quartz substrate in the 185 to 800 nm wavelength region for three films of AlN grown at substrate temperatures of 333 K, 343 K, and 350 K, indicate an increasing band gap with increasing substrate temperature and were used to select the optimum substrate temperature. The substrate temperature should preferably not be raised above 350 K in order to avoid any thermal decomposition of TMAA. Improved vacuum in the system and the removal of moisture and other impurities present in the carrier and purge gases are found to greatly aid the formation of high-quality AlN films without any incorporated oxygen.

At a substrate temperature of 350 K, smooth, well-adhering films of AlN are produced and confirmed by a tape adhesion test. The film growth rate is a function of the incident laser fluence. There is a limit of the growth rate at saturation of the gas phase photochemical reactions under specific gas pressures and photon flux. XRD measurements of 100–200 nm thick films revealed no characteristic diffraction patterns due to AlN, suggesting that the films were amorphous. The lack of crystallinity appears to be related to the low growth temperature.

It is observed that regardless of the growth technique employed, the growth of AlN films on various substrates at temperatures higher than 500 K have typically resulted in epitaxial or preferentially oriented films while depositions at temperatures below 500 K have produced amorphous films. This suggests that crystallinity in thin-films may be improved by providing energy to the components of the film during deposition. This could be achieved either by a direct heating of the substrate (thermal or laser-pyrolytic), or through electronic or internal excitation in the atomic or molecular components of the film that could result from a laser-induced process. The laser beam 50 propagating parallel to the substrate without grazing it precludes any transfer of energy to the substrate surface by laser pulses. The relatively low pulse energy and fluence of the laser beam 50, that are employed minimize internal excitation in the dissociated fragments.

SEM analysis of the AlN films grown on Si(100) and GaAs(100) substrates indicated that the films were smooth and featureless even up to magnifications of 20,000 times. The surface morphology and topography may also be investigated through AFM measurements using a Burleigh-SPM instrument. The topography of a 120 nm thick AlN film on a Si(100) substrate, grown photolytically, shows that a surface area of 1.40 μm×1.40 μm is locally uniform to better than 2% of the film thickness. The surface roughness had a variance of 1.87 nm.

EDX analyses of 110–150 nm thick films on Si(100) and GaAs(100) substrates, using an incident energy of 5 kV revealed signals due to only Al and N, aside from the Si peak or Ga and As peaks from the respective substrates. These EDX data are representative of the bulk composition of the film since the penetration depth of the 5 kV electrons used is approximately 1 μm.

The XPS analysis of a film grown on Si(100) showed that the O content in the bulk of the AlN film is very low (2 atomic percent), and no carbon XP signal was detected. Additionally, the XP signal due to nitrogen corresponded to approximately 42 atomic percent. This indicates that AlN films can be successfully deposited on a Si substrate at low temperatures without incorporation of impurities. The N/Al ratio of 0.8 is consistent with the formation of stoichiometric AlN, with some preferential sputtering of N relative to Al.

High-resolution XPS scans are used on the as-grown, photolytically deposited films to assess chemical state information. The C1s peak is present as two components, due to adsorbed carbonyl groups and adventitious carbon, predominantly the latter. The binding energies of Al2p, N1s, and O2p were referenced to the adventitious C1s binding energy, which was set at 284.6 eV. The binding energy of Al2p was found to be 73.9±0.2 eV. A NIST XPS database indicates a binding energy of 73.9 eV for Al2p in AlN. The binding energy of Al2p in $Al_2O_3$ is in the range of 74.1–74.6 eV, while that of Al2p in aluminum metal is 72.8 eV. The data for the Al2p binding energy observed in the films cannot by itself readily distinguish between $Al_2O_3$ and AlN. The N1s peak can be deconvoluted into 2 peaks, one with a binding energy of 397.3±0.2 eV and a second peak with a higher binding energy of 399.3±0.2 eV. The peak at 397.3 eV can be assigned to AlN, while the peak at 399.3 eV could be due to either N-H or N-C types of interactions. The O1s peak observed on the surface occurs at 531.2±0.2 eV and correlates well to the O1s binding energy of 531.0–531.6 eV in $Al_2O_3$. This data in combination with the post-sputter-etch chemical compositions, show that the bulk film composition is AlN and that the binding energies of Al2p and N1S are consistent with an Al—N bond.

I-V measurements on MIM sandwich structures of Al/AlN/Au showed a breakdown electric field to be $1.2–1.8 \times 10^8$ V/m. With applied electric fields up to $5 \times 10^7$ V/m, the specific resisitivities at 300 K were $0.5–1.0 \times 10^{13}$ ohm-cm. C-V characteristics of an Al/AlN/Si MIS structure at one MHz, measured the capacitance of the device as a function of the applied bias voltage V. The low-frequency dielectric constant of these AlN films was found to be 6.0–6.9 for a known film thickness. The refractive indices of several films ranged from 1.9–2.0, and the corresponding values for the high-frequency dielectric constant were 3.6–4.0.

The optical band gap of laser-grown AlN films is 5.8 eV. The films have a low-frequency dielectric constant of 6.0–6.9, measured at one MHz, and a high frequency dielectric constant of 3.6–4.0, calculated from the measured refractive index at optical frequencies. The films have a very high breakdown electric field. These properties render amorphous AlN films grown at low temperatures using our technique of LCVD suitable for numerous optical and microelectronic applications.

SIMS depth profiles of two films grown under the same conditions of gas pressures, gas flows, and substrate temperature, were measured. These included the depth profile of a 110 nm AlN film grown at a laser fluerice of 80 mJ/cm$^2$ and a second one of a substrate (Si or GaAs) exposed to TMAA and NH$_3$ without the photolysis laser. For the film grown with the laser, the analysis showed an AlN film of mass 41, covered by a surface oxide of aluminum oxide with a signal due to AlO with mass 43. The SIMS analysis of the substrate exposed to the same growth conditions but without simultaneous exposure to photons from the excimer laser, showed no measurable film of AlN on the substrate. The predominant masses observed by the SIMS profile are due to the substrate. A signal due to AlO (mass 43) can be detected on the surface and decays rapidly in the bulk, while practically no secondary ions due to AlN (mass 41) can be detected. This indicates that the growth of AlN occurs only in the presence of the UV photons and is therefore clearly due to a photolytically driven process. Under the experimental conditions used in the present invention, photolysis of one or both precursors appears to be the only channel for the production of AlN.

The present invention employs laser photolysis of TMAA and $NH_3$ precursors for depositing well-adhering, smooth, amorphous films of AlN on substrates at temperatures between 300 K and 373 K and preferably at 350 K. The laser preferably uses a 193 nm parallel flat beam for the photolysis of TMAA and $NH_3$ without substrate irradiation and thermal heating using a fluence preferably in the range 5–200 mJ/cm$^2$ and most preferably 80 mJ/cm$^2$. Chamber evacuation to a high-vacuum and substrate prebake are preferred prior to growth to reduce impurities and contamination in the films. The system preferably uses an argon carrier gas for TMAA delivery, an argon purge gas, though other inert gases could be used, both preferably with a cold bath to eliminate water and impurity contamination. Trimethylamine alane $(CH_3)_3NAlH_3$ (TMAA) is the preferred aluminum containing precursor gas and $NH_3$ is the preferred nitrogen containing precursor gas. However, it should now become apparent that other alkylamine alane compounds containing aluminum, such as triethylamine alane $(C_2H_5)_3NAlH_3$, and dimethylethylamine alane $(CH_3)_2(C_2H_5)NAlH_3$ may be used as the aluminum containing precursor gas, and apparent that other nitrogen hydrides, such as hydrozoic acid $(N_3H)$ and hydrazine $(N_2H_4)$ may be used as the nitrogen containing precursor gas. It should also be apparent that other substrates, such as sapphire, as well as Si and GaAs having orientations other than (100) may be used. The preferred system and method can be modified and enhanced by those skilled in the art. However, those enhancements, improvements and modifications may nonetheless fall within the spirit and scope of the following claims.

What is claimed is:

1. A method for deposition of a thin film of aluminum nitride on the surface of a substrate disposed in a chamber, said method comprising the steps of heating said substrate in said chamber to a temperature between 300 K and 373 K, providing an alkylamine alane precursor gas into said chamber as a source of aluminum for said thin film, and providing a nitrogen hydride precursor gas into said chamber as a source of nitrogen for said thin film, said alkylamine alane precursor gas and said hydride precursor gas mix together proximal to said substrate, and dissociating said alkylamine alane precursor gas and said nitrogen hydride precursor gas in said chamber proximal to said surface of said substrate by a photon source of a wavelength less than 220 nm providing photon dissociation energy to said alkylamine alane precursor gas and said nitrogen hydride precursor gas to form said thin film on said surface.

2. The method of claim 1, wherein said alkylamine alane precursor gas is a TMAA precursor gas and said nitrogen hydride precursor gas is a $NH_3$ precursor gas.

3. A method for deposition of a thin film of aluminum nitride on the surface of a substance disposed in a chamber, said method comprising the steps of, heating said substrate in said chamber to a temperature between 300 K and 373 K, providing a carrier gas, providing a trimethylamine alane (TMAA) vapor from a TMAA source, mixing said TMAA vapor with said carrier gas for providing a TMAA precursor gas, communicating said TMAA precursor gas into said chamber as a source of aluminum, and communicating an ammonia ($NH_3$) precursor gas into said chamber as a source of nitrogen for said thin film, said $NH_3$ precursor gas and said TMAA precursor gas mix together in said chamber proximal to said substrate, and dissociating said TMAA precursor gas and said $NH_3$ precursor gas in said chamber proximal to said surface of said substrate by a photon source of a wavelength less than 220 nm providing photon dissociation energy to said TMAA precursor gas and said $NH_3$ precursor gas to form said thin film on said surface.

4. The method of claim 3 wherein said temperature is controlled at 350 K and said photon source is a 193 nm wavelength excimer laser with a beam fluence of 80 mJ/cm$^2$, said TMAA precursor gas has a partial pressure of $5\times10^{-3}$ torr, and said $NH_3$ precursor gas has a partial pressure of $35\times10^{-3}$ torr.

5. The method of claim 1 wherein said photon source provides a flat laser beam extending parallel and between 1–4 mm from said surface of said substrate without grazing said surface.

6. The method of claim 3 further comprising the steps of communicating a laser beam from said photon source through a window port and a baffled inlet of said chamber, controlling delivery of a purge gas into said inlet of said chamber to prevent deposition of said thin film on said window port, and pumping said purge gas out of said chamber to purge said baffled inlet.

7. The method of claim 3, wherein said photon source provides a laser beam having a fluence range between 5 mJ/cm$^2$ and 200 mJ/cm$^2$, said TMAA precursor gas has a partial pressure between $1\times10^{-3}$ torr and $1\times10^{-2}$ torr, said $NH_3$ precursor gas has a partial pressure between $5\times10^{-3}$ torr and $2\times10^{-1}$ torr, and said chamber is maintained at a total pressure of less than 0.5 torr.

8. The method of claim 3, wherein said $NH_3$ precursor gas and said TMAA precursor gas have a partial pressure ratio of at least 5:1.

9. The method of claim 3, further comprising the steps of, communicating a laser beam from said photon source through a window port and a baffled inlet of said chamber, controlling delivery of a purge gas into said baffled inlet of said chamber to prevent deposition of said thin film on said window port, pumping said purge gas out of said chamber to purge said baffled inlet, and trapping said purge gas and said carrier gas to remove water.

10. The method of claim 1, wherein said substrate is a GaAs substrate.

* * * * *